United States Patent
Asikainen et al.

(10) Patent No.: US 6,639,474 B2
(45) Date of Patent: Oct. 28, 2003

(54) ADJUSTABLE OSCILLATOR

(75) Inventors: Kalle Asikainen, Pirkkala (FI); Pauli Seppinen, Espoo (FI)

(73) Assignee: Nokia Corporation, Espoo (FI)

( * ) Notice: Subject to any disclaimer, the term of this patent is extended or adjusted under 35 U.S.C. 154(b) by 53 days.

(21) Appl. No.: 10/024,084

(22) Filed: Dec. 17, 2001

(65) Prior Publication Data

US 2002/0079975 A1 Jun. 27, 2002

(30) Foreign Application Priority Data

Dec. 22, 2000 (FI) .............................................. 20002836

(51) Int. Cl.[7] .............................. H03L 7/08; H03L 7/085; H03L 7/099
(52) U.S. Cl. ........................ 331/17; 331/1 A; 331/36 C; 331/177 V; 331/179; 327/156; 327/159; 455/260
(58) Field of Search .......................... 331/1 A, 16, 17, 331/18, 25, 36 C, 177 V, 179; 327/156–159; 375/376; 455/260

(56) References Cited

U.S. PATENT DOCUMENTS 5,648,744 A * 7/1997 Prakash et al. ................ 331/11
6,496,075 B2 * 12/2002 Justice et al. .................. 331/11

* cited by examiner

*Primary Examiner*—David C. Mis
(74) *Attorney, Agent, or Firm*—Perman & Green, LLP

(57) ABSTRACT

The invention relates to a method for tuning an adjustable oscillator, in which oscillator at least one resonance circuit is used. The frequency of the oscillator is adjusted by changing the resonance frequency of the at least one resonance circuit by means of a control signal for which a minimum value and a maximum value are selected. In the method at least one target value is selected for the control signal, the frequency of the adjustable oscillator is adjusted to substantially correspond to the target value and the value of the control signal and the target value are compared. When the value of the control signal is substantially different from the target value, a tuning signal is produced to change the resonance frequency of the at least one resonance circuit.

15 Claims, 4 Drawing Sheets

ADJUSTABLE OSCILLATOR

BACKGROUND OF THE INVENTION

1. Field of the Invention

The present invention relates to adjustable oscillator.

2. Brief Description of Related Developments

In electronic devices adjustable oscillators are used especially when two or more different frequencies are required and the implementation of these frequencies with separate oscillators is not reasonable or possible. Furthermore, adjustable oscillators are used for producing frequencies in a particular frequency range. If the stability of the frequency to be produced is not very significant, it is possible to form such an adjustable oscillator as a voltage-controlled oscillator which has no back coupling. However, in many cases it is necessary to attain certain frequency stability. Thus, the frequency produced by an adjustable oscillator at a given time has to be located in a relatively accurate manner on a desired frequency, and the frequency must not vary significantly. Thus, a feedback loop, such as a phase locked loop (PLL), and an accurate reference frequency are used in connection with the voltage-controlled oscillator. By means of a frequency divider located in the feedback of the phase locked loop it is possible to attain desired frequencies which can be kept in the desired value by means of a phase comparator. Such oscillators are necessary especially in communication applications in which a certain frequency range is allocated for a wireless communication device, in which range the transmitter and the receiver have to operate. This is necessary for example to prevent the wireless communication device from interfering with other wireless communication devices in the vicinity. In addition, possible frequency variations may cause excess modulation, which causes interferences in the communication.

In a voltage-controlled oscillator (VCO) the frequency is adjusted by changing the control voltage of the oscillator. The change in the control voltage generates a change in the resonance frequency in the resonance circuit of the oscillator, which changes the frequency produced by the oscillator. This change in the resonance frequency can be advantageously accomplished in such a manner that the capacitance and/or inductance of the resonance circuit is/are adjusted. Typically, the adjustment means used in voltage-controlled oscillators is a voltage-controlled capacitor (capacitance diode, varactor) and/or a group of capacitors composed of several capacitors, wherein such capacitors are selected from this group of capacitors, by means of which the desired oscillator frequency can be produced.

In a phase locked loop the output frequency is produced by means of a voltage-controlled oscillator. The signal produced by this voltage-controlled oscillator is conducted to a frequency divider, which divides the oscillation signal with a divider set in the frequency divider. Thus, the output of the frequency divider contains a signal whose frequency is the frequency produced by the voltage-controlled oscillator divided with the divider. This signal is conducted to a phase detector, and the reference frequency is conducted to the second input branch of the same. The phase detector produces a voltage proportional to the phase difference of the signal of the frequency divider and the reference signal, which voltage is filtered in a filter and thereafter conducted to the input of the voltage-controlled oscillator. Thus, this voltage produced by the phase detector can be used for adjusting the frequency of the voltage-controlled oscillator until the frequency of the voltage-controlled oscillator has been set in its target value. In this situation, the reference signal and the signal produced by the frequency divider have substantially the same phase. This reference signal is produced for example by means of a crystal-controlled oscillator, wherein the phase locked signal can be utilized to produce a stable output frequency, whose frequency can be adjusted.

In electronic devices voltage-controlled oscillators are typically composed of discrete components. However, it is a constant aim to reduce the size of electronic devices, such as wireless communication devices. Thus, the aim is also to integrate the voltage-controlled oscillator in an integrated circuit. Thus, problems are caused for instance by the fact that the capacitances of the capacitors used for example in the resonance circuit of the oscillator vary in different integrated circuits, and changes in temperature result in significant variations in the capacitance. Thus, the frequency control range of the oscillator can shift from the desired one, which complicates the process of producing the correct frequencies in the phase locked loop. The center frequency of the oscillator can for example shift aside to such a degree that the desired frequency range cannot be successfully produced any more, but some of the lower or higher frequencies remain outside the control range. A prior art solution is to adjust the capacitances of the integrated circuit at the manufacturing stage by means of a laser beam, but this method is relatively expensive, and it can be conducted only once, wherein the tuning cannot be performed during the use of the electronic device. Temperature compensation cannot be taken into account either in this laser adjustment. Another alternative for amending this problem is to increase the gain of the voltage-controlled oscillator, i.e. a larger output frequency range is attained in the same control voltage range. Thus, however, the effect of the disturbances on the signal produced by the oscillator is also increased. Yet another alternative is to provide the voltage-controlled oscillator with a wide control range of the control voltage. Especially in portable devices in which the aim is to reduce the operating voltage, such solutions would cause the problem that in order to produce the control voltage of the voltage-controlled oscillator, a voltage converter should be used, by means of which higher voltages can be produced from the lower operating voltage. This, however, increases the power consumption of the electronic device and requires additional components, which is not desirable as the devices become smaller in size and the cost requirements become tighter.

SUMMARY OF THE INVENTION

It is an aim of the present invention to provide an adjustable oscillator and a tuning method for an adjustable oscillator, in which the tuning can also be conducted during the use of the electronic device. The invention is based on the idea that to adjust the oscillator, a tuning stage is conducted, in which the aim is to set the center frequency of the adjustable oscillator to a desired point, substantially in the middle of the control range of the control voltage.

Thus, in one aspect the present invention is directed to a method for adjusting an oscillator. In one embodiment the method comprises tuning an adjustable oscillator, in which oscillator at least one resonance circuit is used, and the frequency of the oscillator is adjusted by changing the resonance frequency of the at least one resonance circuit by means of a control signal, for which a minimum value and a maximum value are selected. At least one target value is selected for the control signal. The frequency of the adjustable oscillator is set to substantially correspond to the target value. The value of the control signal and the target value are compared, and when the value of the control signal is substantially different from the target value, a tuning signal is produced to change the resonance frequency of the at least one resonance circuit.

In another aspect the invention further relates to an adjustable oscillator. In one embodiment the adjustable oscillator comprises at least one resonance circuit, means for controlling the frequency of the oscillator by changing the resonance frequency of the at least one resonance circuit by means of a control signal, for which a minimum value and a maximum value are selected, and means for tuning the oscillator which comprise means for producing at least one target value of the control signal, means for setting the frequency of the adjustable oscillator to substantially correspond to the target value and comparing the value of the control signal and the target value. The oscillator also comprises means for producing a tuning signal to change the resonance frequency of the at least one resonance circuit when the value of the control signal is substantially different from the target value.

In a further aspect the invention also relates to an electronic device. In one embodiment the electronic device comprises an adjustable oscillator which contains at least one resonance circuit, means for controlling the frequency of the oscillator by changing the resonance frequency of the at least one resonance circuit by means of a control signal, for which a minimum value and a maximum value are selected, and means for tuning the oscillator, which comprise means for producing at least one target value of the control signal, means for setting the frequency of the adjustable oscillator to substantially correspond to the target value and comparing the value of the control signal and the target value. The electronic device also comprises means for producing a tuning signal to change the resonance frequency of the at least one resonance circuit when the value of the control signal is substantially different from the target value.

The present invention shows remarkable advantages when compared to solutions of prior art. When the method according to the invention is applied, the control range of the adjustable oscillator can be set to a desired point, wherein for example in communication applications all desired frequencies are attained by means of the oscillator. Tuning according to the invention can also be conducted during the use of the electronic device, and in the tuning it is possible to take into account the possible effects of the temperature on the frequency of the oscillator, wherein the electronic device functions in a more reliable manner. Another advantage attained by means of the invention is that the adjustable oscillator can be implemented in an integrated circuit, wherein the size of the electronic device can be reduced and the manufacturing costs can be decreased. Furthermore, as separate laser tuning is not necessary, the electronic device according to the invention can be manufactured at smaller expenses and within a shorter period of time when compared to a situation where solutions of prior art are used. In that case external measurement devices are not required either.

BRIEF DESCRIPTION OF THE DRAWING

In the following, the invention will be described in more detail with reference to the appended drawings, in which.

DETAILED DESCRIPTION OF THE PREFERRED EMODIMENTS

Figure 1:
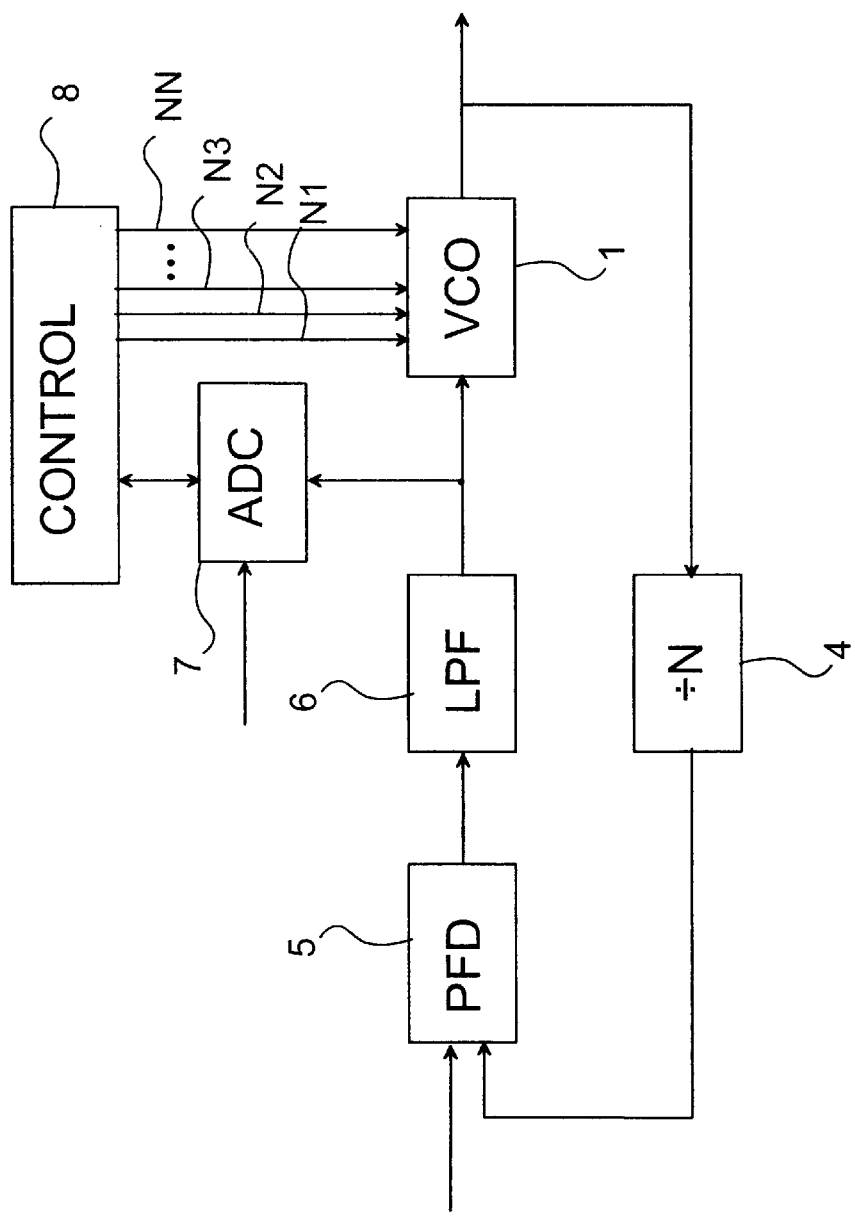
FIG. 1 shows a tuning coupling of an adjustable oscillator according to a preferred embodiment of the invention in a reduced block chart.
Figure 2:
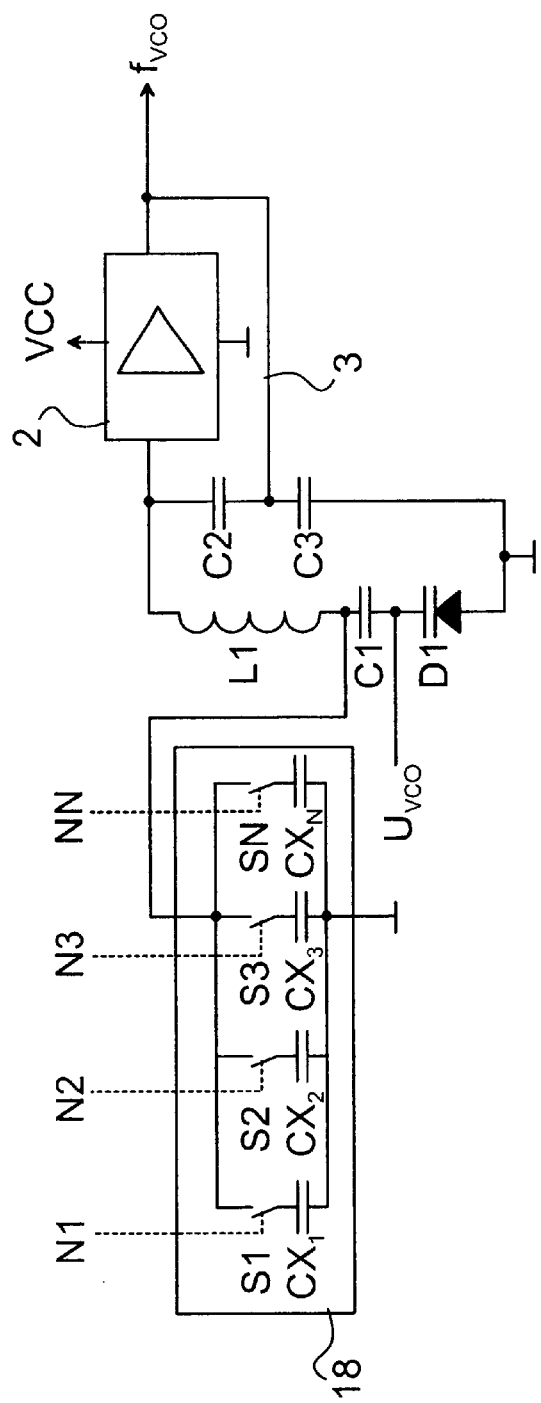
FIG. 2 shows an adjustable oscillator according to a preferred embodiment of the invention in a reduced block chart.

In the following, the invention will be described with reference to FIGS. 1 and 2, using a voltage-controlled oscillator as an example of an adjustable oscillator, but it is obvious that other kind of control method, such as current control, can also be used in connection with the adjustable oscillator 1. In the adjustment of the frequency of the voltage-controlled oscillator 1, for example a voltage-controlled capacitance diode D1 is used. The capacitance of such a capacitance diode D1 is affected by the voltage over the capacitance diode. This capacitance diode D1 is positioned in a frequency control circuit of the adjustable oscillator 1, which forms a resonance circuit. In addition to the capacitance diode D1, the resonance circuit comprises in this preferred embodiment capacitors C1, C2, C3 and a coil L1. The adjustable oscillator also comprises a gain block 2 and a feedback 3 to attain the oscillation of the device. For tuning, the adjustable oscillator is also provided with a tuning block 18. The tuning block 18 comprises means by means of which the resonance frequency of the adjustable oscillator can be changed. In this example the tuning block comprises tuning capacitors $CX_1$, $CX_2$, $CX_3$, $CX_N$ to be selected by switching means S1, S2, S3, SN, said tuning capacitors having a substantially fixed capacitance, but they can be replaced e.g. by a capacitance diode and selectable inductances. The tuning capacitors $CX_1$, $CX_2$, $CX_3$, $CX_N$ are advantageously arranged in such a manner that the capacitance value of each capacitor $CX_1$, $CX_2$, $CX_3$, $CX_N$ is the basic capacitance to the power of two. Thus, for example by means of four tuning capacitances it is possible to attain 16 different capacitance values ($2^N=2^4=16$) For example the first tuning capacitance has the value 1C, the second the value 2C and the third the value 4C (=$2^2$C), etc, in which C is said basic capacitance, for example 1 pF. The output lines N1, N2, N3, NN of the control block 8 are used for controlling the coupling of the capacitors $CX_1$, $CX_2$, $CX_3$, $CX_N$ to the resonance circuit. This coupling can be conducted for example in such a manner that the selection line N1, N2, N3, NN controls a MOS switch, which, in turn, connects the corresponding tuning capacitor to the resonance circuit, or releases this tuning capacitor from the resonance circuit. The control block 8 sets a figure corresponding to the given calculated value as a N-bit binary value, in which N represents the number of tuning capacitances. It is obvious that the example presented herein for the implementation of the voltage-controlled oscillator provides only one example and it is of prior art known by anyone skilled in the art, and thus a more detailed discussion therein is not necessary in this context.

In the method according to a preferred embodiment of the invention, the tuning of the adjustable oscillator 1 is conducted in the following manner. To a divider block 4 a numerical value is inputted, by means of which the divider is preferably positioned in the middle of the control range, i.e. the numerical value is given a value that substantially corresponds to the average value of the minimum value and the maximum value. Thus, the output of the divider block contains the signal produced by the voltage-controlled oscillator divided with this divider. This signal produced by the divider block 4 is conducted to a phase comparator 5 to whose second output a reference signal $f_{ref}$ is conducted. This reference signal $f_{ref}$ preferably has a fixed frequency, and it is produced for example by means of a crystal oscillator (not shown) or the like. Thereafter the phase comparator block 5 produces an output signal, which is proportional to the phase difference between the signal produced by the divider block and the reference signal $f_{ref}$. The signal produced by the comparator block 5 is filtered in a filtering block 6 and conveyed to the control input of the adjustable oscillator 1. Thus, this control voltage $U_{VCO}$ is used for controlling the frequency of the signal $f_{VCO}$ produced by the adjustable oscillator 1. This control loop changes the control voltage $U_{VCO}$ until the phase locked loop has been locked up. Thus, the frequency $f_{VCO}$ produced by the adjustable oscillator has the desired value, i.e. in this case it is substantially in the middle of the frequency range. Thereafter it is examined whether the value of the control voltage $U_{VCO}$ is in the middle of the control range of the control voltage. By means of an analog-to-digital converter 7 the value of the control voltage is converted into a digital form, and it is transmitted to the control block 8 in which the value of the control voltage is compared to a target value $U_{CAL}$. This target value $U_{CAL}$ is a value that corresponds to the average value of the control range. For example, if the control range of the control voltage in the adjustable oscillator is 1 to 4 V, the average value is 2.5 V. Thus, in an optimal situation, this control voltage should have said value of 2.5 V in the center frequency. In the control block 8 the value of this control voltage $U_{VCO}$ is compared to the target value $U_{CAL}$. If the value of the control voltage deviates from the target value, the resonance frequency of the adjustable oscillator 1 is changed. This can be advantageously conducted in such a manner that the capacitance of the resonance circuit is either increased or reduced, depending on that in which direction the correction is necessary. Let us assume that the control block of the resonance frequency in the resonance circuit is set in such a manner that its capacitance is in the middle of the control range. Thus, the capacitance can be reduced by changing the combination of the capacitors coupled to the resonance circuit. Correspondingly, the capacitance can be increased by changing the combination of the capacitors coupled to the resonance circuit. In the example of FIG. 2, the average value of the capacitances of the tuning capacitors is 7.5C. When the value set for the capacitance is for example 7C in the beginning of tuning, the first $CX_1$, the second $CX_2$ and the third tuning capacitor $CX_3$ are coupled to the resonance circuit. Thus, the selection lines N1, N2, N3, NN contain a binary number 0111. If the aim is to reduce the capacitance thereafter, the first tuning capacitor $CX_1$ is detached from the resonance circuit (0110). When the capacitance is further reduced, the second tuning capacitor $CX_1$ is detached from the resonance circuit and the first tuning capacitor $CX_1$ is coupled to the resonance circuit (0101). The capacitance is increased in a corresponding manner. Another alternative is to use for example a voltage-controlled capacitance diode, wherein the control voltage value of the capacitance diode is changed in the desired direction.

The change in the resonance frequency results in that the phase locked loop does not remain locked anymore. In this situation the output voltage of the voltage comparator 5 changes. Thus, the control voltage of the adjustable oscillator changes as well until the phase locked loop has been locked up again. Thereafter a new examining stage of the control voltage is conducted, and the resonance frequency of the resonance circuit is changed, if it is necessary. The above-mentioned stages are repeated until the control voltage of the adjustable oscillator 1 is substantially in the target value. Thereafter the adjustable oscillator 1 can be used in the production of necessary frequencies, and the normal operation of the electronic device can be started. This resonance frequency set in the resonance circuit is kept substantially constant thereafter until the next tuning stage is conducted. The control block 8 advantageously stores the number contained in the selection lines of the tuning capacitors at the tuning stage in a memory, wherein this number can be set in the selection lines during the normal operation of the electronic device.

The tuning of the adjustable oscillator according to the invention can be conducted either at fixed intervals during the operation of the electronic device, activated by the user of the electronic device or during the activation of the electronic device. On the other hand, the electronic device 1 can comprise diagnostic means with which it is possible to monitor the function of the adjustable oscillator 1, and if it is detected that for example the control range is no longer sufficient for producing all the necessary frequencies, it is possible to conduct a tuning stage according to the invention. This way it is possible to compensate e.g. the effects of changes in the operating temperature in the function of the adjustable oscillator 1.

Figure 3:
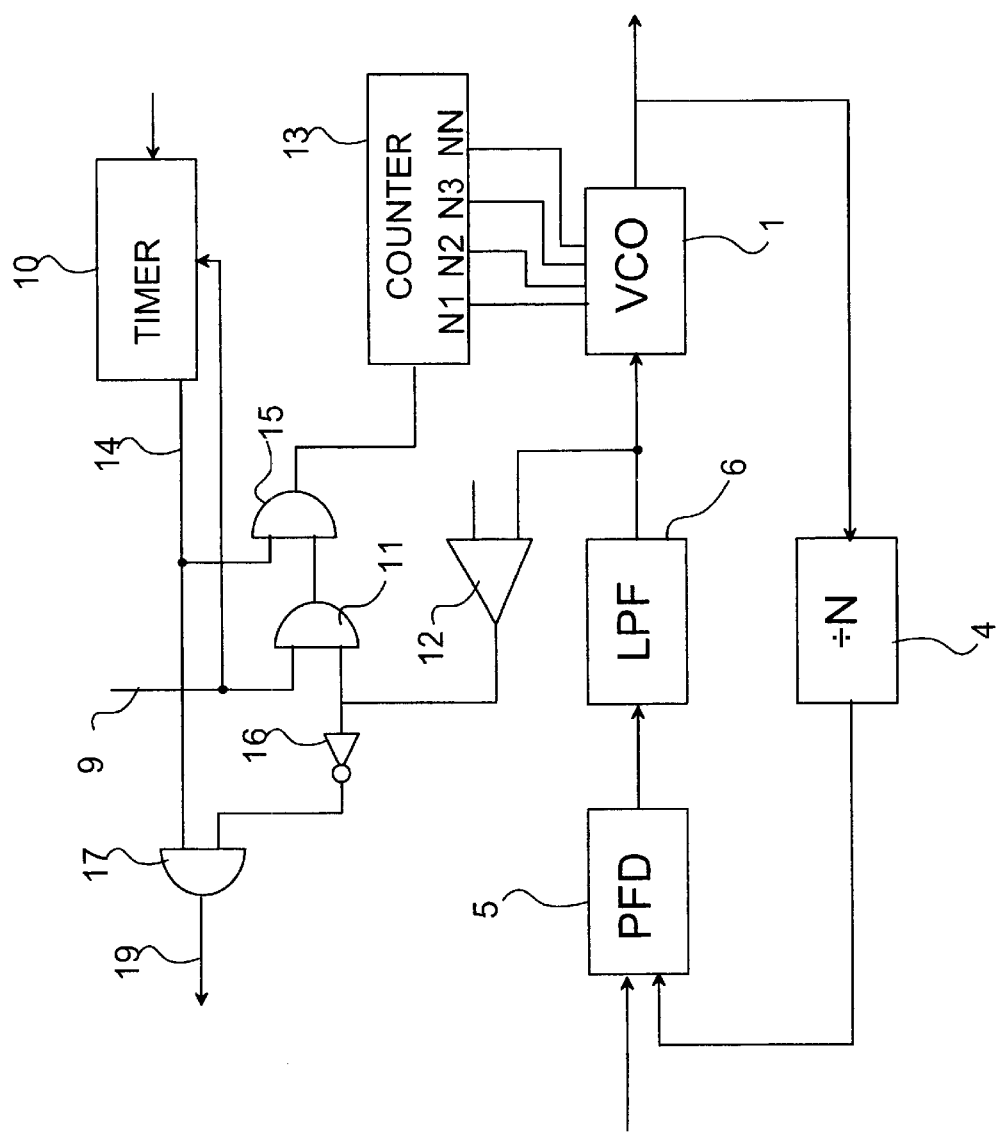
FIG. 3 shows a tuning coupling of an adjustable oscillator according to a second preferred embodiment of the invention in a reduced block chart.

FIG. 3 shows a coupling according to a second preferred embodiment of the invention, by means of which the tuning of the adjustable oscillator 1 according to the invention can be conducted. In this embodiment, the tuning is advantageously conducted in the following way. The divider of the divider block 4 is set into a value by means of which the aim is to set the adjustable oscillator into center frequency. In addition, a value is set into a start line 9 of tuning by means of which the tuning is initiated, advantageously to a state corresponding to the logic 1 state. This causes the adjustment of the first calculating block 10 to zero. Furthermore, this information is conducted to an AND circuit 11. The voltage produced by a comparator 12 is conducted to the second input of this AND circuit 11. By means of this comparator the magnitude of the control voltage of the adjustable oscillator 1 is compared in relation to the target voltage which advantageously corresponds to the average value of the voltage control range. This voltage control range can extend for example from 0 volt to the operating voltage VDD. Thus, the target voltage is preferably a voltage VDD/2 that corresponds to the median of the operating voltage. In the beginning of tuning, the second calculation block 13 is also initialized into its initial value, advantageously it is adjusted into zero. The second calculating block 13 is used for controlling the number of tuning capacitances coupled to the resonance circuit of the adjustable oscillator 1. In this embodiment it is assumed that in the beginning, none of the tuning capacitances is coupled to the resonance circuit, but it is obvious that in practical applications these couplings can be arranged in a manner different from the one presented herein.

The time used by the phase locked loop for locking up is monitored by the first calculation block 10. This time is set in such a manner that the phase locked loop is locked up in all tuning capacitance values during this period of time. After it has been calculated by the first calculation block 10 that this calculated time has expired, the calculation block 10 sets the overflow data into the output line 14. This overflow data is advantageously the logic 1 state, wherein the second AND circuit 15 sets a value in its output that corresponds to the binary signal produced by the comparator 12. If the control voltage of the adjustable oscillator 1 is lower than the target voltage, the output voltage of the comparator is typically close to the operating voltage, which in this embodiment corresponds to the logic 1 state. Thus, a pulse is produced for the second calculation block 13, which causes an increase of one unit in the calculated value of the second calculation block 13. This, in turn, results in that the capacitance of the resonance circuit of the adjustable oscillator is changed into the following value, advantageously into a value larger than one basic capacitance C. The change in the resonance frequency results in that the phase locked loop is no longer locked. Thus, the output voltage of the phase comparator changes, which also changes the control voltage of the adjustable oscillator 1 until the phase locked loop has been locked up again. After the first calculation block 10 has calculated the determined calculated time again, the logic state corresponding to the output value of the comparator 12 is transferred to the second calculation block 13. If the value of the control voltage is even smaller than the reference voltage, the value of the second calculation block 13 is increased again by one unit. The above-mentioned procedures are repeated until the control voltage has reached a value corresponding to the target voltage in which the output value of the comparator 12 changes its state, in this example approximately 0 volts, i.e. the logic 0 state. As a result of this, the output voltage of the comparator 12 that is reversed in an inverter 16 is conducted to a third AND circuit 17. Thus, because both inputs of the AND circuit contain a value corresponding to the logic 1 state, the output 19 of this third AND circuit 17 also contains a value corresponding to the logic 1 state. This indicates that the tuning has been conducted. In the control block 8 the value of this line 19 is monitored and thus it can be deduced that the tuning can be terminated and the electronic device can be set into its normal operating mode. Now, the value reached during the tuning remains in the second calculation block 13, wherein the resonance circuit of the adjustable oscillator 1 remains in the set resonance frequency, and the desired control range has thus been attained for the adjustable oscillator.

Although one target value was used in the tuning in connection with the description of the above-mentioned preferred embodiments of the invention, the invention can also be applied in such a manner that the tuning is conducted in a number of different target values, and the tuning capacitance value coupled to the resonance circuit during the normal operation of the adjustable oscillator is selected on the basis of the tuning results obtained in different target values. One example that can be mentioned is a tuning with three target values, such as the minimum, maximum and average value of the control voltage range. If a different kind of tuning capacitance value is attained with different target values, the tuning capacitance value selected to be used in the operation is advantageously an average value or median of these values.

Figure 4:
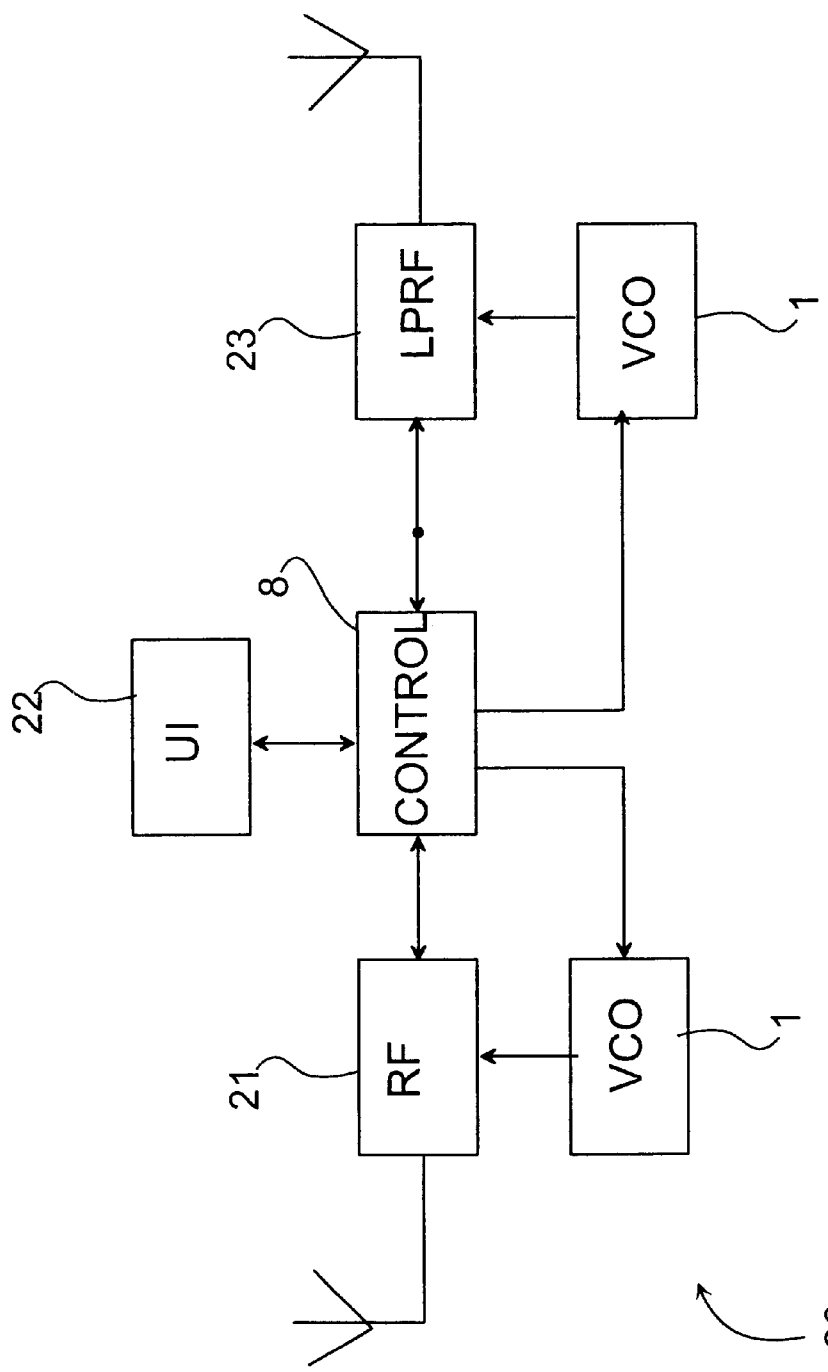
FIG. 4 shows the structure of an electronic device according to a preferred embodiment of the invention.

The present invention can advantageously be applied in connection with portable electronic devices, such as wireless communication devices, in which it is necessary to attain adjustable frequencies. An example of such a wireless communication device 20 is shown in a reduced block diagram in the appended FIG. 4. A radio part 21 is used in the communication between a mobile communication network and a wireless communication device 20. A user interface 22 is used in the communication between the wireless communication device 20 and the user in a manner known as such. The adjustable oscillator 1 according to the invention can be applied for example in the production of the channel frequencies of the radio part 21, as well as in connection with possible short-range information transmission means 23, for example in connection with a so-called Bluetooth transmitter/receiver.

It is obvious that the present invention is not limited solely to the above-presented embodiments, but it can be modified within the scope of the appended claims.

What is claimed is:

1. A method for tuning an adjustable oscillator, in which oscillator at least one resonance circuit is used, and the frequency of the oscillator is adjusted by changing the resonance frequency of said at least one resonance circuit by means of a control signal, for which a minimum value and a maximum value are selected, at least one target value is selected for the control signal, the frequency of the adjustable oscillator is set to substantially correspond to said target value, and said value of the control signal and the target value are compared, and when the value of the control signal is substantially different from the target value, a tuning signal is produced to change the resonance frequency of said at least one resonance circuit.

2. The method according to claim 1, wherein in the tuning the resonance frequency of the resonance circuit is changed by changing the capacitance of the resonance circuit.

3. The method according to claim 1, wherein the average value of said minimum value and maximum values is selected as said target value.

4. The method according to claim 1, wherein said comparison of the value of the control signal and the target value and the act of changing the value of the control signal are repeated until the value of the control signal is substantially the same as the target value.

5. The method according to claim 1, wherein a binary control signal is used as said tuning signal.

6. The method according to claim 1, wherein said adjustable oscillator is used in connection with a phase locked loop, wherein said adjustment signal is produced in the phase locked loop and that in the tuning, after the resonance frequency has been changed, the value of said control signal and the target value are compared when the phase locked loop has been locked up.

7. The method according to claim 6, wherein a minimum value, a maximum value and a threshold value are determined for said tuning signal, and that in the method at least the following steps are performed:
   initialization step in which said tuning signal is set to said minimum value,
   locking step in which the system waits for the locking up of the phase locked loop,
   comparison step in which the value of the control signal is compared with the target value, wherein when the comparison shows that the value of the control signal deviates substantially from the target value, the value of said tuning signal is changed with said threshold value,
wherein said locking stage and comparison stage are repeated until the value of the control signal is substantially the same as the target value.

8. An adjustable oscillator, which comprises at least one resonance circuit, means for controlling the frequency of said oscillator by changing the resonance frequency of said at least one resonance circuit by means of a control signal, for which a minimum value and a maximum value are selected, and means for tuning the oscillator which comprise means for producing at least one target value of the control signal, means for setting the frequency of the adjustable oscillator to substantially correspond to said target value and comparing said value of the control signal and the target value, and the oscillator also comprises means for producing a tuning signal to change the resonance frequency of said at least one resonance circuit when the value of the control signal is substantially different from the target value.

9. The oscillator according to claim 8, wherein in the means for tuning the oscillator comprise a resonance circuit for changing the capacitance.

10. The oscillator according to claim 8, which comprises means for repeating the comparison of said value of the control signal and the target value and the act of changing the value of the control signal until the value of the control signal is substantially the same as the target value.

11. The oscillator according to claim 8, wherein said tuning signal is a binary control signal.

12. An electronic device, which comprises an adjustable oscillator which contains at least one resonance circuit, means for controlling the frequency of said oscillator by changing the resonance frequency of said at least one resonance circuit by means of a control signal, for which a minimum value and a maximum value are selected, and means for tuning the oscillator, which comprise means for producing at least one target value of the control signal, means for setting the frequency of the adjustable oscillator to substantially correspond to said target value and comparing said value of the control signal and the target value, and the electronic device also comprises means for producing a tuning signal to change the resonance frequency of said at least one resonance circuit when the value of the control signal is substantially different from the target value.

13. The electronic device according to claim 12, which comprises a phase locked loop which comprises means for producing said control signal, and which electronic device comprises means for examining the locking of the phase locked loop and means for comparing in the tuning, after the resonance frequency has been changed, the value of the control signal and the target value when the phase locked loop has been locked up.

14. The electronic device according to claim 13, wherein a minimum value, a maximum value and a threshold value are determined for said tuning signal, and that the oscillator also comprises means for setting said tuning signal to said minimum value, means for waiting for the locking of the phase locked loop, means for comparing the value of the control signal with the target value, means for changing the value of said tuning signal with said threshold value when the comparison shows that the value of the control signal deviates substantially from the target value, and means for repeating the act of waiting for the locking and comparison until the value of the control signal is substantially the same as the target value.

15. A wireless communication device, which comprises an adjustable oscillator which contains at least one resonance circuit, means for adjusting the frequency of said oscillator by changing the resonance frequency of said at least one resonance circuit by means of a control signal for which a minimum value and a maximum value are selected, and means for tuning the oscillator, which comprise means for producing at least one target value of the control signal, means for setting the frequency of the adjustable oscillator to substantially correspond to said target value and comparing said value of the control signal and the target value, and the wireless communication device also comprises means for producing a tuning signal to change the resonance frequency of said at least one resonance circuit when the value of the control signal is substantially different from the target value.

* * * * *